United States Patent [19]
Kuki et al.

[11] Patent Number: 6,097,320
[45] Date of Patent: Aug. 1, 2000

[54] ENCODER/DECODER SYSTEM WITH SUPPRESSED ERROR PROPAGATION

[75] Inventors: Ryohei Kuki; Koshiro Saeki, both of Tokyo, Japan

[73] Assignee: Silicon Systems, Inc., Tustin, Calif.

[21] Appl. No.: 09/009,664

[22] Filed: Jan. 20, 1998

[51] Int. Cl.[7] .............................. H03M 5/00; H03M 7/00
[52] U.S. Cl. ................................................. 341/58; 341/59
[58] Field of Search .............................. 341/95, 106, 58, 341/59; 360/57; 395/800.23; 714/746; 375/340, 341

[56] References Cited

U.S. PATENT DOCUMENTS

| | | |
|---|---|---|
| 4,707,681 | 11/1987 | Eggenberger et al. . |
| 5,537,112 | 7/1996 | Tsang . |
| 5,604,497 | 2/1997 | Sonntag . |
| 5,635,933 | 6/1997 | Fitzpatrick et al. . |
| 5,717,395 | 2/1998 | Zook ......................................... 341/59 |
| 5,757,822 | 5/1998 | Fisher et al. .......................... 341/58 X |
| 5,764,170 | 6/1998 | Nabeta et al. .............................. 341/95 |
| 5,854,596 | 12/1998 | Immink ................................. 341/59 X |

OTHER PUBLICATIONS

IBM Technical Disclosure Bulletin, "Rate 16/17 (0,6/6) Code," vol. 31, No. 8, Jan. 1989.
Silicon Systems, A Texas Instruments Company, SSI 32P4101 "EPRML Read Channel w/15/17's, ENDEC, 4–Burst Servo (A,B,C,D) Prototype," Mar. 6, 1997.

*Primary Examiner*—Michael Tokar
*Assistant Examiner*—Patrick Wamsley
*Attorney, Agent, or Firm*—W. Daniel Swayze, Jr.; Wade James Brady, III; Richard L. Donaldson

[57] ABSTRACT

A magnetic recording system with a rate 16/17(0,6/8) encoder/decoder modulation code. This modulation code has a low k constraint for synchronization of a road clock of the magnetic recording system. Furthermore, this magnetic recording system has a low hard error rate due to low 3- and 4-byte error propagation. The digital logic circuit for the encoder/decoder system is elegantly simple. Such simplicity reduces propagational delays and circuit size, as measured in number of logic gates. The modulation code is implemented with a decoder that includes a lower byte decoder and an upper byte decoder. An input of the upper byte decoder is in part coupled to and in part decoupled from the lower byte decoder. Similarly, an input of the lower byte decoder is in part coupled to and in part decoupled from the upper byte decoder.

19 Claims, 7 Drawing Sheets

FIG. 9

$E = C9 * C8 * C7$
$F = C9 * C8 * \overline{C7} * C6$
$G = C10 * \overline{C9} * C8 * C7$
$H = C10 * \overline{C8} * C7 * \overline{C6}$
$I = \overline{C10} * \overline{C9} * \overline{C8} * C7 * \overline{C6}$
$J = C10 * \overline{C9} * C8 * \overline{C7} * \overline{C6}$
$K = (C9 + C7) \overline{C8} * C6$
$L = \overline{C10} * \overline{C9} * C8 * C7$
$M = \overline{C10} * C9 * \overline{C8} * \overline{C6}$
$N = \overline{C9} * C8 * \overline{C7}$
$P = C10 * \overline{C9} * \overline{C8} * \overline{C7} * C6$
$Q = \overline{C10} * \overline{C9} * \overline{C8} * \overline{C7} * \overline{C6}$
$R = C9 * C8 * \overline{C7} * \overline{C6}$
$S = C10 * C9 * \overline{C8} * \overline{C7} * \overline{C6}$
$U = E + F + G + H + R$
$V = K + L + M$
$T = N + P + Q$
$W = E + F + G + I + K + L + T$
$Z = U + V + N$ $A15 = (U+V+T)C16$
$A14 = Z*C15$
$A13 = (U+N+P)C14 + Q*C15 + K*C10 + M*C7 + L*C6$
$A12 = Z*C13$
$A11 = (Z+S+I+J)C12 + P*C15$
$A10 = (Z+R+S)C11 + (I+J)C15 + (Q+P)C12$
$A9 = J*C14 + (I+P+S)C13 + (E+N+R)C10 + (H+K)C9 + M*C5 + G$
$A8 = (I+J)C16 + H*C5 + F + G + T + R + S$
$A7 = V + T + R + S$
$A6 = (I+J+P+Q)C11 + F*C10 + K*C7 + (E+G+N)C6 + (H+M+R+S)C3$
$A5 = (W+J+R+S)C5 + (H+M)C1$
$A4 = (W+H+J+R+S)C4 + M*C0$
$A3 = W*C3 + J*C2$
$A2 = W*C2 + (R+S)C1$
$A1 = (W+J)C1$
$A0 = (W+R+S)C0$

FIG. 10

$B = A15 + A14 + A13 + A12$    $D = A3 + A2 + A1 + A0$    $T = A8 * A7 (A3+A1)$
$U = B * \overline{A7}$    $V = \overline{A8} * A7$
$E = \overline{A8} * U * D$    $F = \overline{A9} * A8 * U * D$    $G = A9 * A8 * U * D$    $H = U * \overline{D}$
$I = \overline{B} * \overline{A7} (A2+A0)$    $J = \overline{B} * A7 (A2+A0)$
$K = (A9+A6) V * D$    $L = \overline{(A9+A6)} * V * D$    $M = V * \overline{D}$
$N = (A14+A12) T$    $P = \overline{(A14+A12)} (A11+A9) T$    $Q = \overline{(A14+A12)(A11+A9)} T$
$R = A8 * A7 * \overline{(A3+A1)} * B$    $S = A8 * A7 \overline{(A3+A1)} * \overline{B}$
$W = E + F + G + I + K + L + T$    $Z = U + V + N + R$ $C16 = (U+V+T+R)A15 + (I+J)A8+S$
$C15 = Z*A14 + Q*A13 + P*A11 + (I+J)A10+S$
$C14 = (U+N+P+R)A13 + J*A9 + I+V+Q+S$
$C13 = Z*A12 + (I+P+S)A9 + J+Q$
$C12 = (Z+I+J+S)A11 + (P+Q)A10$
$C11 = (Z+S)A10 + (I+J+P+Q)A6$
$C10 = K*A13 + (E+N+R)A9 + F*A6 + G+H+J+P+S$
$C9 = (H+K)A9 + E+F+M+R+S$
$C8 = E+F+G+L+N+R$
$C7 = M*A13 + K*A6 + E+G+H+I+L$
$C6 = L*A13 + (E+G+N)*A6 + F+K+P+Q$
$C5 = M*A9 + H*A8 + (W+J+R+S)A5$
$C4 = (W+H+J+R+S)A4 + M$
$C3 = (H+M+R+S)A6 + W*A3 + J$
$C2 = J*A3 + W*A2 + H+M+R+S$
$C1 = (H+M)A5 + (R+S)A2 + (W+J)A1$
$C0 = M*A4 (W+R+S)A0 + H+J$

ENCODER/DECODER SYSTEM WITH SUPPRESSED ERROR PROPAGATION

BACKGROUND OF THE INVENTION

A digital magnetic recording system employs a modulation code for magnetic recording and reading of binary data on magnetic media. A modulation code is implemented by an encoder and a decoder. The encoder encodes a data word by mapping the data word one-to-one onto a code word. The magnetic recording system then stores the code word onto a magnetic recording media, such as hard discs, using a NRZI (modified non-return-to-zero) format.

A magnetic recording system usually stores binary information on magnetic media as magnetic transitions. These magnetic transitions are coded binary waveforms. In NRZI format, a magnetic transition is a code word bit of value logic one. When reading a code word from the magnetic media, a magnetic transition results in an electric pulse for the readback signal. Conversely, a logic zero is represented by the absence of a magnetic transition. The maximum and minimum spaces between consecutive transitions correspond to the maximum and minimum run lengths of zeros between two consecutive ones in a code word, as discussed further below.

Typically, magnetic recording systems employ a partial-response channel (PR) with a maximum-likelihood (ML) detector. Examples of PR channels are PR4 and EPR4 channels. An example of a maximum-likelihood detector is a Viterbi detector. The combination of a PR channel with a ML detector often is referred to as a PRML channel. Usually such magnetic recording systems employ run length limited modulation codes.

Run length limited codes are denoted as follows: I/J(d,k/k1). "I" represents the length of the data word in numbers of bits and "J" represents the length of the code word in numbers of bits. The ratio of I/J is the code rate. "d" is the minimum number of consecutive zeros between ones. Typically, d equals zero. "k" is the maximum number of zeros between ones. The smaller k is the easier it is for a PLL (phase-locked loop) in the magnetic recording system to recover a clock signal that is embedded code words. In addition, a low value of k facilitates automatic gain control in the magnetic recording system.

PR4 channels have the capability of de-multiplexing code words into odd-index and even-index sub-sequences. A maximum-likelihood detector processes each sub-sequence independently. Consequently, PRML channels include a further constraint, k1, that is the maximum number of consecutive zeros in each of the sub-sequences. "k1" is the maximum number of zeros between ones in the odd and even substrings. In EPR4 channels, a small value of k1 reduces the path memory size of the maximum-likelihood detector.

Many magnetic recording systems use rate 8/9 modulation code. Other types of codes are rate 16/17 codes. Compared with the 16/17 codes, the rate 8/9 codes suffer from the disadvantage of lower recording densities. Yet, a typical disadvantage of 16/17 codes is higher error propagation as compared with rate 8/9 codes. Error propagation means that, for example, an error event (e.g., a single error bit) in a code word causes error bits in both bytes of the corresponding decoded word, i.e, the data word. Indeed, in rate 16/17 codes, error propagation can cause three or four byte errors to occur in consecutive sixteen bit words. An ECC (error correction code) circuit in the magnetic recording system can have its performance substantially degraded by such three or four byte errors especially for a non-interleaved ECC. The result is a relatively high uncorrectable error rate or hard error rate of the magnetic recording system. Typically, the hard error rate is measured as uncorrectable sectors divided by number of bits read.

To reduce the error propagation, the value of k may be increased to 12. However, the consequence of such a large value of k is that code words with large numbers of consecutive zeros may be encountered. In such instances, a PLL of the magnetic recording system can lose lock with the embedded clock of the code words.

FIG. 1 shows a prior art rate 16/17 decoder 110. The decoder 110 accepts a 17-bit code word 114 on input lines C0–C16. The decoder 110 outputs a data word output bits on output lines A0–A15. The decoder 110 is a full code word decoder. This means that due to error propagation any bit on any input line C0–C16 can affect the output bits on output lines A0–A15, as further discussed below.

FIG. 2 illustrates the error propagation of the prior art rate 16/17 decoder 114 of FIG. 1. In FIG. 2, a rate 16/17 decoder 114 decodes a first word 218 and a second word 222. As shown in FIG. 2, decoder 214 first receives code word 218 and then code word 222. Code word 218 includes error bits 220. The remaining bits of code word 218 are error free. Similarly, code word 222 includes error bits 226 with the remaining bits being error free. Referencing to FIG. 1, error bits 220 occur on input lines C15 and C16, and error bits 226 occur on input lines C1 and C2. The output of decoder 114 are data words 226 and 230. Because an error bit on any input line C0–C16 can cause error(s) on any output line A0–A15, there is a significant probability that data words 226, 230 will have a 4-byte error, as shown. As illustrated in FIG. 2, byte1 234, byte2 238, byte3 242, and byte4 246 have errors. Therefore, ECC 250 will have to error correct a 4-byte error, i.e., an error in each byte of two data words. As mentioned, 4-byte errors can result in a significant hard error rate.

SUMMARY OF THE INVENTION

The invention in a preferred embodiment includes a rate 16/17(0,6/8) encoder/decoder system. This system has a relatively low k constraint resulting in frequent transitions between binary ones and zeros for synchronization of a read clock of the magnetic recording system. The low k constraint also facilitates automatic gain control. Furthermore, a magnetic recording system employing this encoder/decoder system has a low hard error rate, This low hard error rate results from the encoder/decoder system being able to substantially reduce the number of 3- and 4-byte errors. The digital logic circuit for the encoder/decoder system is elegantly simple. Such simplicity reduces propagational delays and circuit size, as measured in number of logic gates.

BRIEF DESCRIPTION OF THE DRAWINGS

FIG. 9 lists the digital circuit logic equations for the decoder of FIG. 4.

FIG. 10 lists the digital circuit logic equations for a rate 16/17(0,6/8) encoder.

DETAILED DESCRIPTION OF THE PREFERRED EMBODIMENTS

The invention in a preferred embodiment includes a rate 16/17(0,6/8) encoder/decoder system. This system has a relatively low k constraint resulting in frequent transitions between binary ones and zeros for synchronization of a read clock of the magnetic recording system. The low k constraint also facilitates automatic gain control. Furthermore, a magnetic recording system employing this encoder/decoder system has a low hard error rate. This low hard error rate results from the encoder/decoder system being able to substantially reduce the number of 3- and 4-byte errors. The digital logic circuit for the encoder/decoder system is simple. Such simplicity reduces propagational delays and circuit size, as measured in number of logic gates.

Figure 1:
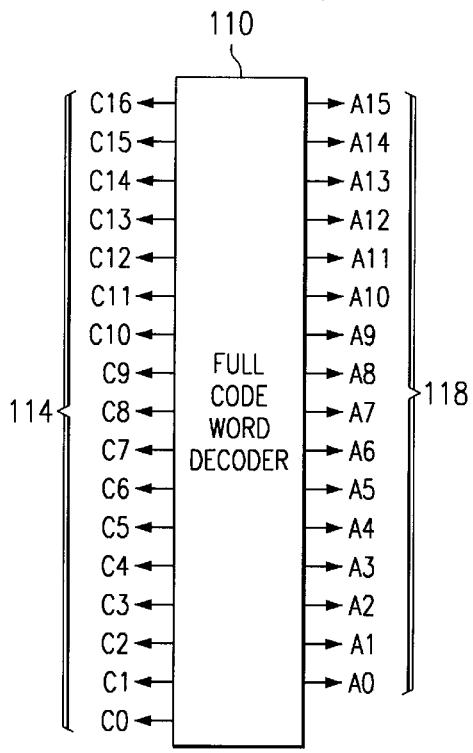
FIG. 1 is clock diagram of a rate 16/17 prior art decoder.
Figure 2:
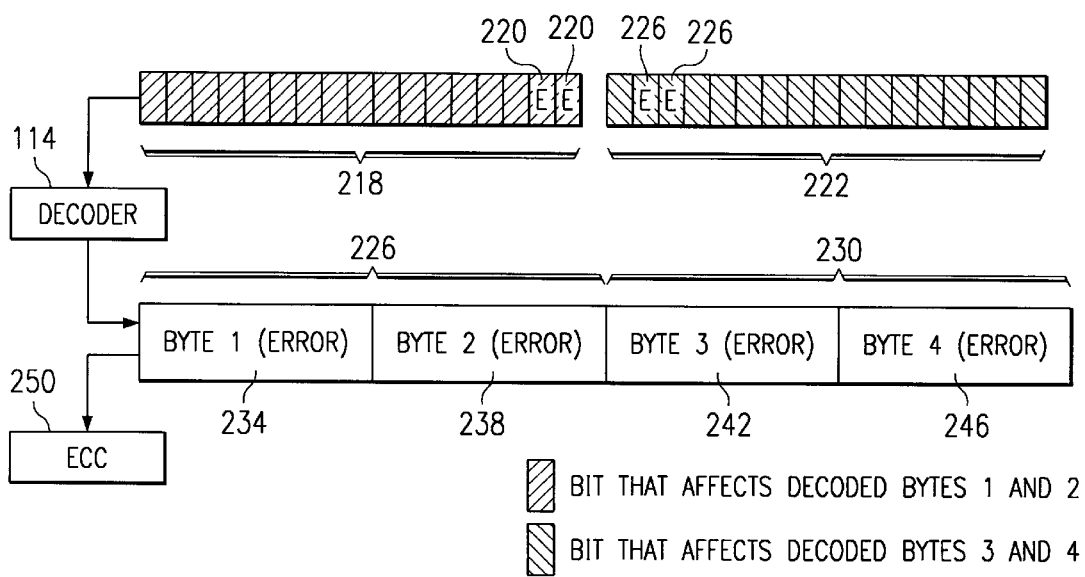
FIG. 2 is an error propagation diagram illustrating the error propagation of the prior art rate 16/17 decoder of FIG. 1.
Figure 3:
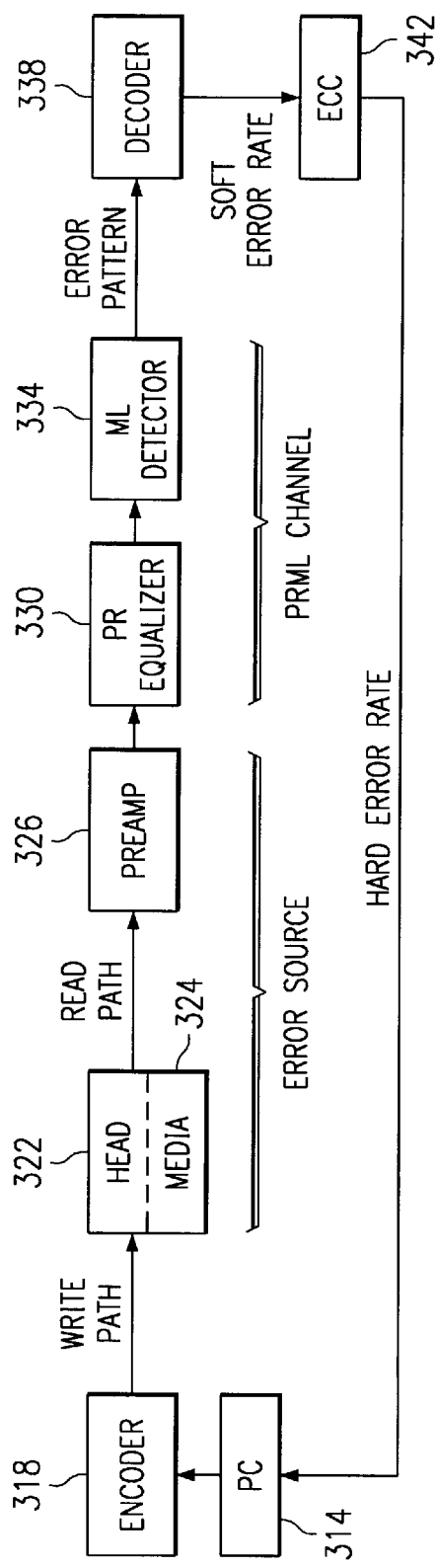
FIG. 3 is a magnetic recording system including a rate 16/17 encoder/decoder, in accordance with a preferred embodiment of the invention.

FIG. 3 shows a magnetic recording system with a rate 16/17(0,6/8) encoder 318 and decoder 338. For illustrative purposes, FIG. 3 is a simplified version of a magnetic recording system. A more detailed diagram for a magnetic recording system is discussed further below. In FIG. 3, a personal computer 314 transmits data words to an encoder 316. The encoder 318 encodes the data words and outputs code words. The code words map uniquely onto data words one-to-one. A magnetic head 322 records the code word onto magnetic recording media 324, such as hard discs.

For the read path, the magnetic head 322 reads the data from the media 324. A pre-ampliffier 326 amplifies the read signal and transmits it for processing by a PRML channel. The PRML channel includes a PR (partial response) equalizer 330 and a ML (maximum-likelihood) detector 334. The PR equalizer 330 can be, for example, a PR4 or an EPR4 equalizer. The maximum-likelihood detector 334 can be, for example, a Viterbi detector.

An output of the maximum-likelihood detector 334 is coupled to a rate 16/17(0,6/8) decoder. The decoder 338 decodes the code words back into data words. The decoder 338 is connected to an ECC 342. The ECC 342 performs error correction on the data read from the decoder 338 and outputs the corrected data word back to the personal computer 314.

When the magnetic recording system reads the encoded word from the media 324, error bits can be created. The error bits usually occur in the Viterbi detector 334. An error bit is, for example, a code word bit of logic value zero when the encoded bit was encoded as a logic one. The main causes of such error bits are media noise, electronic noise, and media defects. Typically, noise is introduced in the area of the head 322, the media 324, and the pre-amplifier 326, as shown in FIG. 3.

The PRML channel interprets the code word that was read from the media 324 and corrects at least some of the error bits. However, the PRML channel may not be able to correct all errors. Consequently, the output of the maximum-likelihood detector 334 can include error bit patterns in the detected code words, as further discussed below.

The decoder 338 decodes the detected code word that it receives from the maximum-likelihood detector 334. Due to the error patterns in the output of the maximum-likelihood detector 334, the data words of the decoder 338 will include a soft error rate. The soft error rate (also referred to as the raw error rate) is the error rate of the data words just prior to processing by the ECC 342. Because this decoder 338 minimizes 3 and 4-byte errors, the ECC 342 will have a relatively low hard error rate.

Tables 1 and 2 below show the dominant error patterns for PR4 and EPR4 channels, respectively.

TABLE 1

PR4 channel dominant error bit patterns

| A-1 | E_E |
| A-2 | E____E |
| A-3 | E_____E |
| A-4 | E_____E |
| A-5 | E_____E |

TABLE 2

EPR4 channel dominant error bit patterns

| B-1 | E_E |
| B-2 | E____E |
| B-3 | E_____E |
| B-4 | E_____E |
| B-5 | E_____E |
| C-1 | EE_EE |
| C-2 | EE____EE |
| C-3 | EE_____EE |
| C-4 | EE_____EE |
| C-5 | EE_____EE |
| C-6 | EE_____EE |

In Table 1, the error patterns are labeled A-1 through A-5. In both, Tables 1 and 2, "E" stands for an error bit and an underscore stands for a correct bit. So, the error pattern A-1 has three bits. The fist and third bits are error bite and the middle bit is a correct bit.

Similarly, Table 2 shows the dominant error patterns for an EPR4 channel. error patterns are labeled B-1 through B-5 and C-1 through C-6. Patterns B-1 through B-5 are similar to patterns A-1 through A-5. However, patterns C-1 through C-6 each have four error bits.

Of these dominant error bit patterns, the most dominant patterns for the PR4 channel are error bit patterns A-1 and A2. For the EPR4 channel, the most dominant error bit patterns are B-1, B-2, C-1, and C-2. The system of FIG. 3 eliminates almost all 3-byte and 4-byte errors, which as mentioned above, contribute significantly to a significant hard error rate.

Figure 4:
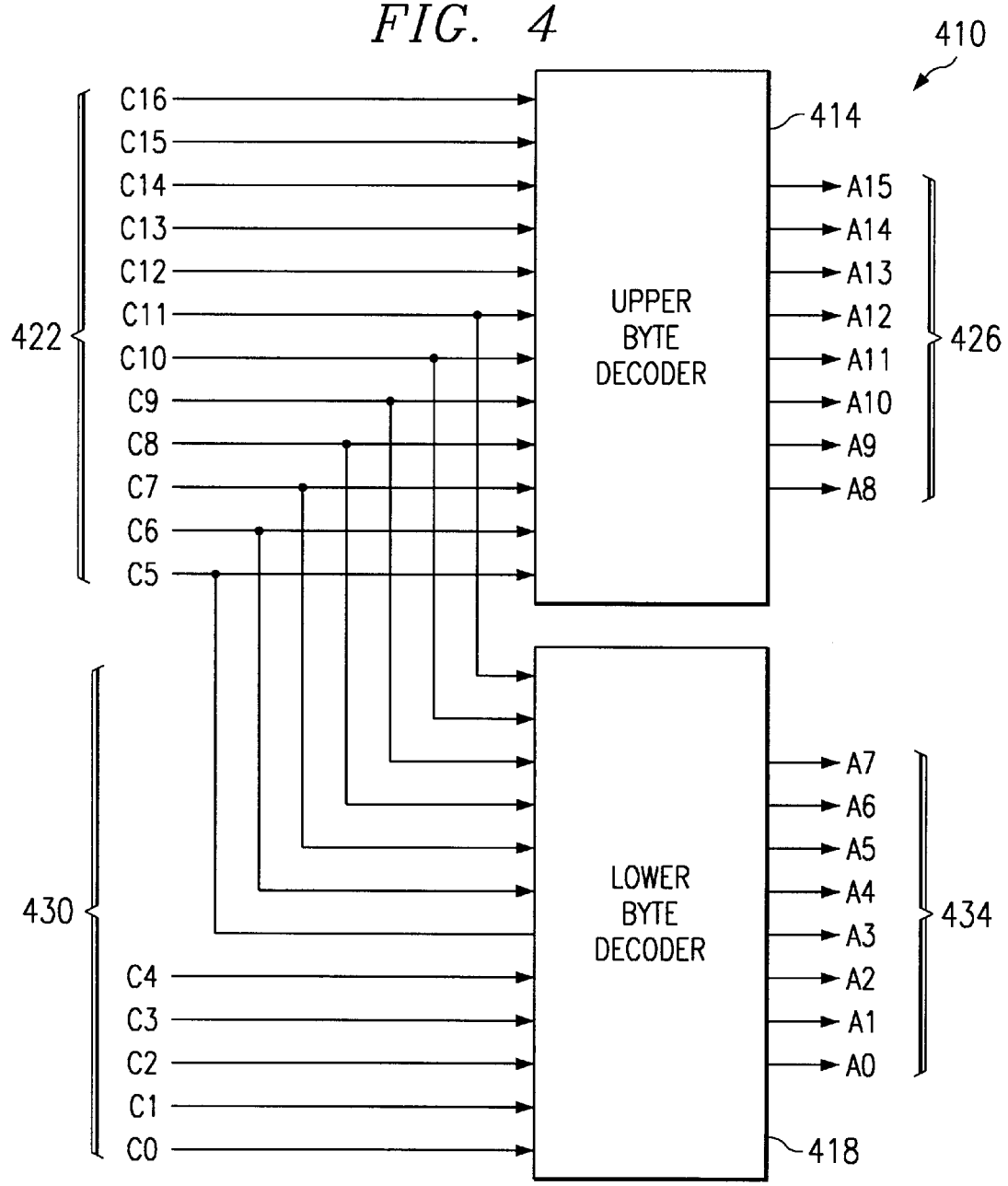
FIG. 4 is a block diagram of a rate 16/17(0,6/8) decoder in accordance with a preferred embodiment of the invention.

FIG. 4 is a block diagram of a rate 16/17(0,6/8) decoder in accordance with a preferred embodiment of the invention. The decoder 410 includes an upper byte decoder 414 and a lower byte decoder 418. The upper byte decoder 414 has an input 422 that includes bit input lines C5–C16. The upper byte decoder 414 has an output 426 that includes bit output lines A8–A15. The lower byte decoder has an input 430 that includes bit input lines C0–C11. So, upper byte and lower byte decoders share input lines C5–C11. The lower byte decoder 418 has an output 434 that includes bit output lines A0–A7.

The decoder 410 functions as follows. The decoder 410 accepts a 17-bit code word on bit input lines C0–C16. Input line C0 accepts the least significant bit and input line C16 accepts the most significant bit of the code word. The decoder 410 outputs a 16-bit data word, i.e., two bytes. The least significant byte is output on output 434 and the most significant byte is output on output 426. Specifically, the least significant bit of the 16-bit output word is output on output line A0, whereas the most significant bit is output on output line A15.

Code word bits on input lines C5–C11 are coupled to both outputs 426 and 434 of the decoder 410. Therefore, input lines C5–C11 can affect any one of the data word bits on output lines A0–A15, as discussed further below. But word bits on input lines C0–C4 are decoupled from the output 426 of the upper byte decoder 414. Similarly, word bits on input lines C12–C16 are decoupled from the output 434 of the lower byte decoder 418. FIG. 9, discussed further below, lists logic equations for the decoder 410 that describe the digital circuit that achieves this coupling and decoupling of input lines C0–C16. As a result of this decoupling, described in logic equations in FIG. 9, code word bits on input lines C0–C4 affect only output 434 of the lower byte decoder 418. Similarly, code word bits on input lines C2–C16 only affect the output 426 of the upper byte decoder 414, as also further discussed below.

Figure 5:
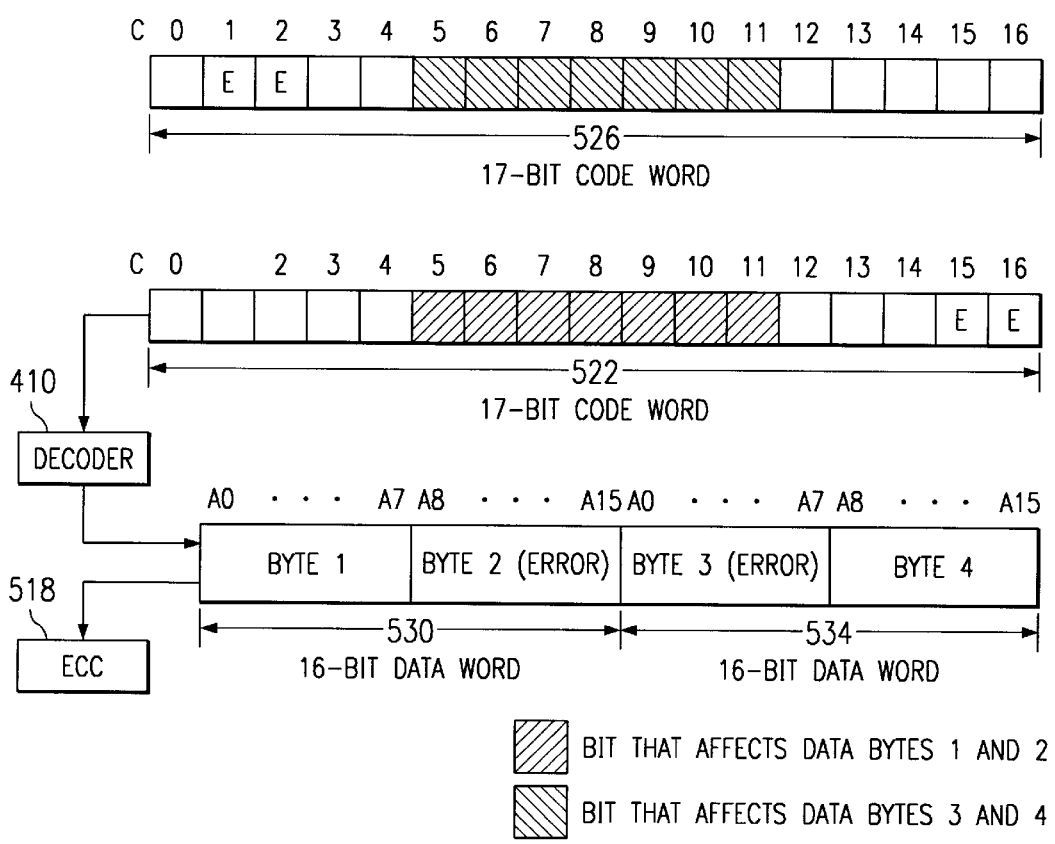
FIG. 5 is an error propagation diagram that illustrates a reduced error propagation for the rate 16/17(0,6/8) decoder of FIG. 4.

FIG. 5 is an error propagation diagram that illustrates the reduced error propagation for the rate 16/17(0,6/8) decoder 410 of FIG. 4. For simplicity, only two of the blocks in the magnetic recording system diagram of FIG. 3 are shown here: the decoder 410 and an ECC 518. The decoder 410 decodes code words 522 and 526 into data words 530 and 534, respectively. Each code word 522 and 526 has code word bits C0–C16 that are applied to inputs 422 and 430 of the decoder 410.

In code word 522, bits C15 and C16 are error bits. In code word 526, bits C1 and C2 are error bits. The decoder outputs each of the data words 530 and 534 on outputs 426 and 434 of FIG. 4. As shown in FIG. 5, code word bits C5–C11 affect both bytes of each data word 530, 534, whereas code word bits C0–C4 and C12–C16 do not. In other words, errors in code word bits C5–C11 can propagate into data words 530, 534, but errors in code word bits C0–C4 and C12–C16 can only propagate to the output 434 of the lower byte decoder 418 and to the output 426 of the upper byte decoder 414, respectively.

To illustrate, the code words 522 and 526 together include the error pattern C1 shown in Table 2, discussed above. Error bits C15 and C16 only cause errors in the output 426 of upper byte decoder 414 because input lines C15 and C16 are decoupled from the output 434 of the lower byte 418. Consequently, of the two bytes of the data word 530, only byte2 will be an error byte: byte1 will be correct. Similarly, the error bits C1 and C2 of the code word 526 will only cause errors in the output 434 of the lower byte decoder 418, thereby creating an error byte, i.e., byte3 in FIG. 5. Byte4, the other byte of code word 526, will be error free.

Figure 6:
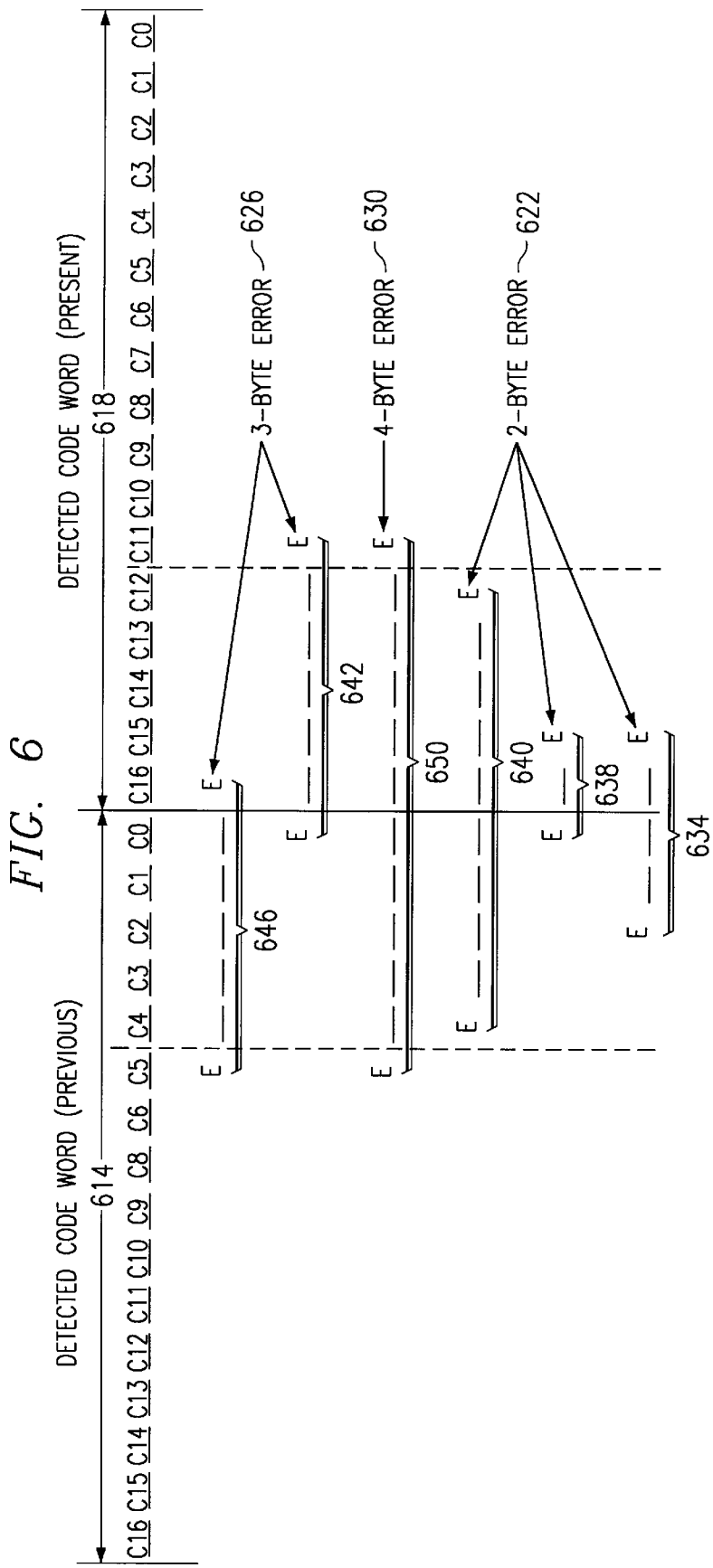
FIG. 6 is an error propagation diagram that shows sample error patterns in code words that can cause 2-byte, 3-byte, and 4-byte errors in data words for the rate 16(0,6/8) decoder of FIG. 4.

FIG. 6 is an error propagation diagram that shows sample error patterns in code words that can cause 2-byte, 3-byte, and 4-byte errors in data words for the rate 16(0,6/8) decoder 410 of FIG. 4. FIG. 6 shows code words 614 and 618, both of which are detected by the maximum-likelihood detector 334 of FIG. 3. The maximum-likelihood detector 334 detects code word 614 before code word 618.

In FIG. 6, error patterns 634, 638, and 640 cause at most 2-byte errors 622. Error patterns 642 and 646 cause at most 3-byte errors 626, and error pattern 650 cause at most a 4-byte error 630. To illustrate the notation in FIG. 6, error pattern 634 includes five bits, C0–C2 and C15–C16, of which bits C2 and C15 are error bits denoted by an "E." The underscores "_" denote bits that are correct. However, changing the correct bits into error bits in this error pattern (or any of the other error patterns in FIG. 6) does not increase the number of error bytes in the data words 530, 534.

Error pattern 634 corresponds to error pattern A-2 of the PR4 channel and to the error pattern B-2 of the EPR4 channel listed in Tables 1 and 2. Similarly, the other error patterns 638, 640, 642, and 646 correspond to error pattern listed in Tables 1 and 2. Error pattern 650 is not listed in Tables 1 and 2 because it is not a dominant error pattern. However, error pattern 650 is shown in FIG. 6 to illustrate the rare instance when a 4-byte error can occur in this encoder/decoder system.

Regarding error pattern 634, as explained with reference to FIGS. 4 and 5, the error propagation will be limited to a maximum of only two bytes. There will only be two error bytes because error bits C2 and C15 (whether from previous or present code words) affect only the output 434 of the lower byte decoder 418 and the output 426 of the upper byte decoder 414, respectively. Similarly, the error bits of error patterns 638 and 840 propagate only into a maximum of two bytes of the four bytes of the data words 530, 534 in FIG. 5.

Error pattern 642 causes a maximum of three error bytes 626 in data words 530, 534. Error pattern 642 includes error bits C0 and C11. While error bit C0 in error pattern 642 can only cause an error in the lower byte decoder output 434, error bit C11 can cause an error in both, i.e., the output 426 of the upper byte decoder 414 and the output 434 of the lower byte decoder 418. With reference to FIG. 5, both bytes of data word 534 would have errors, i.e., be error bits. Similarly, error pattern 648 can cause a 3-byte error in output words 530, 534.

Error pattern 650 is the rare error pattern that can cause a 4-byte error 630 in data words 530, 534. As can be seen from FIGS. 4, 5 and 6, error bit C5 of code word 614 can propagate into both outputs 426,434 of decoder 410. Similarly, error bit C11 of code word 614 can propagate into both outputs 426, 434 of the decoder 410. Thus, error bits C5 of code word 614 and C11 of code word 618 together can cause up to four error bytes in data words 530 and 534.

Error pattern 650, however, occurs only rarely. As mentioned above, in PR4 channels, error patterns that occurs most often are error patterns A-1 and A-2 listed in Table 1. In an EPR4 channel, the dominant error patterns among those listed in Table 2 are error patterns B-1, B-2, C-1, and C-2. The remaining error patterns, even those listed in Tables 1 and 2, have a relatively low probability of occurring.

FIGS. 9 and 10 list the logic circuit equations for the encoder 318 and decoder 410 in a preferred embodiment of this invention. The logic equations shown in FIG. 9 for the decoder 410 are explained below. The logic equations shown in FIG. 10 for the encoder 318 can be readily understood by one of ordinary skill in this art based on the discussion of the logic equations for the decoder 410.

FIG. 9 lists the logic equations for bit output lines A0–A15. For simplicity of the decoder circuit, the logic equations for A0–A15 are expressed in terms of partitions E, F, G, H, I, J, K, L, M, N, P, Q, R and S. In the logic equations of FIG. 9 (and of FIG. 10), a "+" denotes a logic OR, a "*" logic AND. No space between a parenthesis and a character also stands for a logic AND. To illustrate, the logic equation for partition K, when written out, is as follows: K equals (C9 OR C7) AND C8 inverse AND C6.

For simplicity, the logic equation for output lines A0–A15 also are expressed in terms of intermediate equations U, V, W and Z. According to a presently preferred embodiment, the logic equations of FIG. 9 are implemented in a digital logic circuit. Expressing the outputs for bit output lines A0–A15 in terms of partitions, simplifies the logic circuit design of the decoder 410.

The logic equations of FIG. 9 uniquely map each code word onto a data word, as explained further below. Only one partition at a time can be a logic one. For instance, when partition E is a logic one, the remaining partitions F–S equal logic zero.

The following discussion illustrates the design of the logic equations of FIG. 9 to achieve the unique mapping of code words to data words. Because of the unique mapping, any given code word can only correspond to a single data word. The logic equations of FIG. 9 incorporate the preferred constraints of the rate 16/17(0,6/8) code. So, here k equals six. This constraint can be realized by eliminating code words with consecutive four zeros at either end or seven consecutive zeros within, as shown below, For instance, bit input lines C0–C3 cannot all simultaneously equal logic zeros. Similarly, bit input lines C13–C16 cannot simultaneously equal logic zeros.

The following binary logic equations describe in detail the constraint of k=6.

$$C16+C15+C14+C13=1 \qquad (1)$$

$$C15+C14+C13+C12+C11+C10+C9=1 \qquad (2)$$

$$C14+C13+C12+C11+C10+C9+C8=1 \qquad (3)$$

$$C13+C12+C11+C10+C9+C8+C7=1 \qquad (4)$$

$$C12+C11+C10+C9+C8+C7+C6=1 \qquad (5)$$

$$C11+C10+C9+C8+C7+C6+C5=1 \qquad (6)$$

$$C10+C9+C8+C7+C6+C5+C4=1 \qquad (7)$$

$$C9+C8+C7+C6+C5+C4+C3=1 \qquad (8)$$

$$C8+C7+C6+C5+C4+C3+C2=1 \qquad (9)$$

$$C7+C6+C5+C4+C3+C2+C1=1 \qquad (10)$$

$$C3+C2+C1+C0=1 \qquad (11)$$

Similarly, the following binary logic equations describe the constraint k1=8.

$$C16+C14+C12+C10+C8=1 \qquad (12)$$

$$C15+C13+C11+C9+C7=1 \qquad (13)$$

$$C8+C6+C4+C2+C0=1 \qquad (14)$$

$$C9+C7+C5+C3+C1=1 \qquad (15)$$

Of the possible 131,072 17-bit code words (i.e., $2^{17}$), 102,309 code words satisfy equations (1)–(15). There are 66,536 data words (i.e., $2^{16}$. At this point in the design, there are still many more code words available than there are data words for uniquely mapping the code words to data words. But the total number of available code words is ultimately reduced by the coupling and de-coupling requirements of the decoder design of FIG. 4.

The fourteen partitions E, F, G, H, I, J, K, L M, N, P, Q, R and S, implement the coupling and decoupling requirements of the decoder 410 of FIG. 4. The main partitions are E, F, G, N and K in the sense that most of the code words are mapped through them, as explained below.

From FIG. 9, it is clear that partition E is selected, i.e., partition E equals logic one, when bit input lines C9=C8=C7=1. When partition E is selected, equations (2)–(10), (12)–(15) are satisfied, thus leaving as constraints only equations (1) and (11). As a result, partition E includes 14,400 possible code words. Preferably, all of these 14,400 code words are uniquely mapped to data words by setting A15=C16, A14=C15, A13=C14, A12=C13, A11=C12, A10=C11, A5=C5, A4=C4, A3=C3, A2=C2, A1=C1 and A0=C0. The complete mapping for partition E can be obtained by setting partition E to logic one and the remaining partitions to logic zero in logic equations (FIG. 9).

Partitions F and G are similar to partition E. Partitions F and G each include 7,200 possible code words that are uniquely mapped to data words. Again, as for partition E, partitions F and G are mapped as follows: A15=C16, A14=C15, A13=C14, A12=C13, A11=C12, A10=C11, A5=C5, A4=C4, A3=C3, A2=C2, A1=C1 and A0=C0. The mapping for the remaining bit input lines to bit output lines is believed to be apparent from the logic equations of FIG. 9 to persons skilled in the art.

Partition N is selected, i.e., equals logic one, when C9=0, C8=1 and C7=0. Using these logic values for C7, C8 and C9 simplifies equations (1)–(1 5). The result of this simplification are equations (16)–(19) shown below.

$$C16+C15+C4+C13=1 \qquad (6)$$

$$C15+C3+C11=1 \qquad (17)$$

$$C3+C2+C1+C0=1 \qquad (18)$$

$$C5+C3+C1=1 \qquad (19)$$

11,664 code words satisfy equations (16)–(19). However, equations (20) and (21) shown belowfurther simplify equations (16)–(19).

$$C15+C13=1 \qquad (20)$$

$$C3+C1=1 \qquad (21)$$

9.216 code words in partition N satisfy equations (20) and (21). Again, logic equations of FIG. 9 map the code words of partition N uniquely onto data words by setting, as for partition E, A15=C16, A14=C15, A13=C14, A12=C13, A11=C12, A10=C11, A5=C5, A4=C4, A3=C3, A2=C2, A1=C1 and A0=C0. The remaining assignments of bit input lines to bit output lines are apparent to persons skilled in the art from the logic equations in FIG. 9.

Similarly, partition constraint equations for partition K reduce to equations (22) and (23) shown below.

$$C3+C2+C1+C0=1 \qquad (22)$$

$$C14=1 \qquad (23)$$

Partition K includes 11,520 possible code words, all of which are uniquely assigned to data words.

Together, the main partitions E, F, G, N and K account for the unique mapping of 49,536 code words to data words. Consequently, 16,000 data words remain to the assigned by selecting from partitions H, I, J, L, M, P, Q, R and S. While designs can vary, preferably, 1920, 1536, 512, 3840, 1024, 2304, 768, 3840 and 256 code words are selected, respectively, from these partitions. The logic equations of FIG. 9 show the actual unique mapping of all code words to data words.

As is clear from the above discussion and the decoder logic equations of FIG. 9, the upper byte decoder 414 generates its output 426 independent of bit input lines C0–C4. Similarly, the lower byte decoder 418 generates its output 434 independent of bit input lines C12–C16. Based on the description herein, one of ordinary skill in the art will understand that while the above discussed mapping of code words to data words is unique, many other unique mappings are possible within the above constraints. Indeed, are of ordinary skill in the art will understand that the even the coupling and decoupling constraints can be varied. Less decoupling will tend to increase the hard error rate of the magnetic system of FIG. 3 but will tend to simplify the encoder/decoder design. More decoupling will tend to have the opposite effect. Variations of the foregoing nature are believed to be within the spirit and scope of the present invention.

FIG. 10 lists the preferred logic equations for the encoder 318 of FIG. 3. The encoder encodes 16-bit data words and generates 65,536 17-bit code words that satisfy the (0,6/8) code constraints. The design considerations for uniquely mapping the data words onto the code words for the encoder are similar to those for decoders 338 and 410. As for the design of the decoder logic equations, a goal for the encoder logic equations is simplicity in the equations.

FIG. 10 lists the logic equations for C0–C16. FIG. 10 also shows the partitions for the encoder equations, shown above the logic equations. Additionally, for simplicity, the encoder logic equations include intermediate equations W and Z. The encoder 318 does not include the coupling and decoupling constraints of the decoder 410. Due to the absence of the decoupling constraints, the encoder logic equations can be simplified beyond the simplification of the decoder equations of FIG. 9.

In another embodiment according to the present invention, the encoder 318 includes the decoupling constraint as illustrated in FIG. 4 for decoder 410. The block diagram for the encoder in such an embodiment is identical to that of the decoder 410, except that the direction of the arrows is reversed. In this embodiment, preferably, simplicity of logic equations is still maintained. As already mentioned, simple logic equations allow for a simple logic circuit implementation, and a less expensive and less failure prone magnetic recording system. As one of ordinary skill in the art will understand based on the description herein, even with a simple encoder circuit, many logic equations are possible that still satisfy the constraints of the rate 16/17(0, 6/8) code.

Figure 7:
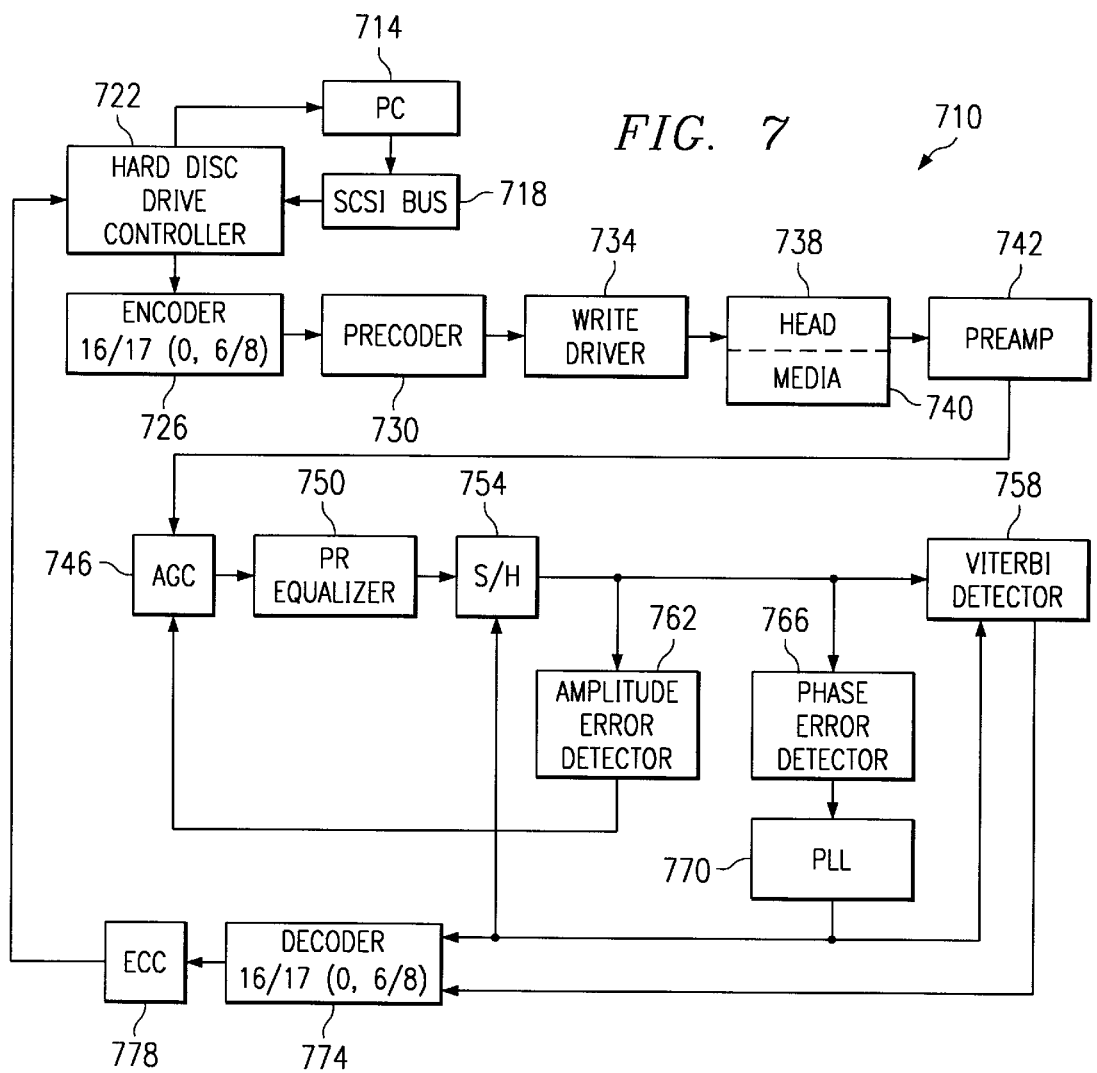
FIG. 7 is a detailed block diagram of the magnetic recording system of FIG. 3.

FIG. 7 is a detailed block diagram of the magnetic recording system of FIG. 3. The magnetic recording system 710 is a mixed signal system, i.e., it includes a mixture of digital and analog components. For simplicity, control lines are not shown for the system 710.

In system 710, a personal computer 714 is connected to a SCSI bus 718. The SCSI bus 718 in turn is connected to a hard disc drive controller 722. The hard disc drive controller 722 connects to a rate 16/17(0,6/8) encoder 726 that, in turn, is connected to a precoder 730. The precoder 730 is connected to a write driver 734. The write driver 734 is connected to a magnetic head 738 that is used to write encoded data to and read from media 740. Media 740 are, for instance, hard discs of a hard disc drive. In other data processing systems, the media can be tapes, floppy discs or compact discs.

The head 738 further is connected to a preamplifier 742 that, in turn, is connected to an automatic gain control circuit 746. The automatic gain control circuit 746 is connected to a partial response equalizer 750 that, for example, can be a PR4 or an EPR4 equalizer. The PR equalizer 750 is connected to a sample-and-hold circuit 754, which in turn is connected to an analog Viterbi detector 758. The Viterbi detector 758 is connected to a rate 16/17(0,6/8) decoder 774. Decoder 774 is connected to an ECC (error correction coding circuit) 778. The ECC 778 in turn is connected back to the hard disc drive controller 722.

An amplitude error detector 762 is connected between the sample-and-hold circuit 754 and the automatic gain control circuit 746. A phase error detector 766 is connected to the sample-and-hold circuit 754. A PLL 770 is connected to the sample-and-hold circuit 754, to the Viterbi detector 758, and to the decoder 774.

From FIG. 7, one of ordinary skill in the art can appreciate that the magnetic recording system 710 functions to write data from the PC (personal computer) 714 to the media 740 and to read data from media 740 for transmission back to the PC 714. Prior to writing the data to the media 740, the encoder 726 encodes the data from the PC 714. The precoder 730 processes the code words from the encoder 726 that the Viterbi detector 758 would be unable to decode. The precoder 730 implements the logic equation shown below.

$$b_k = [a_k - b_{k-1}]_{mod\ 2} \qquad (24)$$

where "b" stands for the $b^{th}$ bit of the output of the precoder 730, "a" stands for the $a^{th}$ input bit to the precoder 730, and "k" is the timing index. So, in equation (24), the precoder 730 outputs bit $b_{k-1}$ one clock cycle before bit $b_k$. Per equation (24), b can be either 1 or 0. The precoder 730 processes inputs from the encoder 726 according to equation (24) regardless of whether the magnetic recording system of FIG. 7 uses a PR4 or EPR4 channel. As one of ordinary skill in the art will understand based on the description herein, many other precoders can be used.

The phase error correction portion of the magnetic storage system of FIG. 7 includes the phase error detector 766 combined with the PLL 770. This phase error correction portion provides clock signals for processing the code words as sampled by the sample-and-hold circuit 754. The phase error correction portion recovers a clock signal embedded in the sampled code words. The phase error correction portion performs clock recovery notwithstanding the constraint of k=6 that allows six consecutive zeros to occur in code words.

Figure 8:
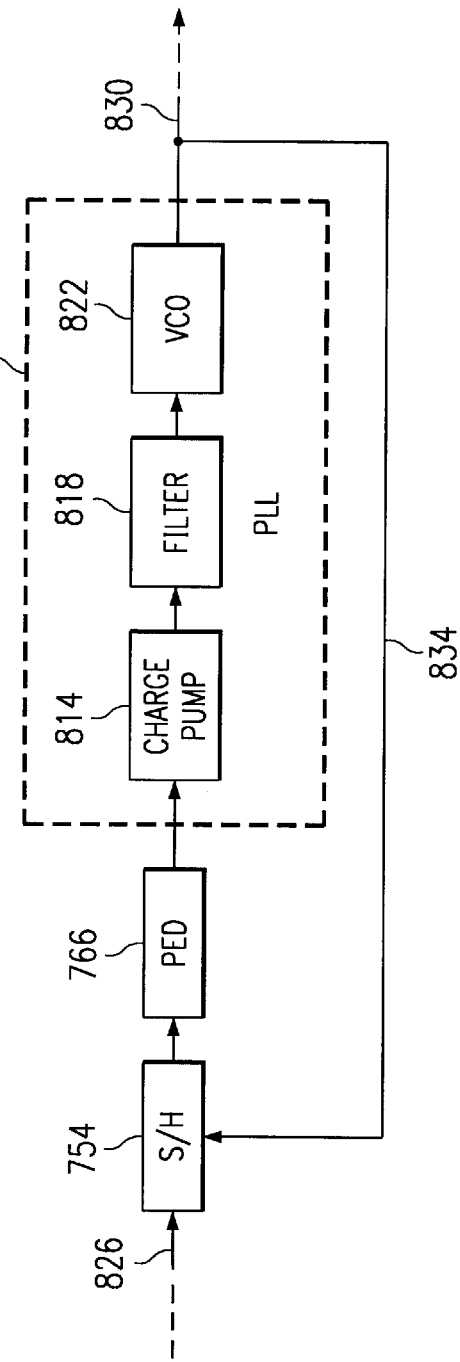
FIG. 8 is a detailed diagram of the phase correction portion of the magnetic recording system of FIG. 7.

FIG. 8 is a more detailed diagram of the phase error correction portion of the magnetic recording system of FIG. 7. The phase error correction portion is connected to the sample-and-hold circuit 754 and includes the phase error detector 766 and the PLL 770. The PLL 770 includes a charge pump 814 connected to a filter 818 connected to a VCO (voltage controlled oscillator) 822. An input 826 of the sample-and-hold circuit 754 is connected to the PR equalizer 750 (see FIG. 7). The VCO includes an output 830. A feedback path 834 connects an output 830 of the VCO 822 to the sample-and-hold circuit 754.

The combination of the phase error detector 766 with the PLL 770 generates a phase correction signal for the sample-and-hold circuit 754. This phase correction signal is transmitted on feedback path 834. The phase correction signal on feedback path 834 functions to adjust the timing of the sample-and-hold circuit 754, i.e., the time at which sample-and circuit 754 samples and holds the signal available on its input 826. In PRML channels, the sample-and-hold circuit 754 will, with correct timing, sample the signal available on its input 826, such that it samples this signal at partial response targets of 1, 0, and −1 for PR4 channels and 2, 1, 0, −1, −2 for EPR4 channels.

In another embodiment according to the invention, the magnetic recording system 710 can be implemented with more digital components. For example, the analog Viterbi detector 758 can be replaced with a digital Viterbi detector. Accordingly, the sample-and-hold circuit 754 is replaced with an analog-to-digital converter. Similarly, the phase error detector 766 connected to the PLL is replaced by a digital phase error detector connected to a digital PLL.

Several preferred embodiments of the present invention have been described. Nevertheless, it will be understood that various modifications may be made without departing from the spirit and scope of the invention. For example, it will be clear to one of ordinary skill in the art based upon the above description that, in other embodiments, the encoder/decoder can be implemented as computer code or a combination of digital circuits with computer code. Thus the present invention is not limited to the preferred embodiments described herein but may be altered in a variety of ways, which will be apparent to a person skilled in the art based on the present description.

What is claimed:

1. A decoder comprising:

a lower byte decoder having an input and an output; and an upper byte decoder having an input and an output, the input of the upper byte decoder in part directly coupled to and in part decoupled from the lower byte decoder, and the input of the lower byte decoder in part directly coupled to and in part decoupled from the upper byte decoder.

2. The decoder of claim 1, wherein the input of the upper byte decoder includes twelve input lines, five of which are decoupled from the lower byte decoder.

3. The decoder of claim 1, wherein the input of the lower byte decoder includes twelve input lines, five of which are decoupled from the upper byte decoder.

4. The decoder of claim 1, wherein the decoder is a rate 16/17(0,6/8) decoder.

5. A system comprising:

a rate 16/17(0,6/8) encoder; and a rate 16/17(0,6/8) decoder coupled to the encoder.

6. The system of claim 5, wherein the decoder is a digital circuit.

7. The system of claim 5, wherein the decoder includes a lower byte decoder having an input and an output, and an upper byte decoder having an input and an output, the input of the upper byte decoder in part coupled to and in part decoupled from the lower byte decoder, and the input of the lower byte decoder in part coupled to and in part decoupled from the upper byte decoder.

8. The system of claim 5, wherein the encoder includes a lower byte encoder having an input and an output, and an upper byte encoder having an input and an output, the output of the upper byte encoder in part directly coupled to and in part decoupled from the lower byte encoder, and the output of the lower byte encoder in part directly coupled to and in part decoupled from the upper byte encoder.

9. The system of claim 5, wherein the encoder is a digital circuit.

10. The system of claim 5, further comprising:

a partial response maximum-likelihood channel coupled between the encoder and the decoder; and an error correction code circuit coupled to the decoder.

11. The system of claim 10, wherein the partial response maximum-likelihood channel includes a Viterbi detector coupled to the decoder.

12. The system of claim 10, further comprising a microprocessor coupled to the encoder.

13. A process for decoding a code word into a data word comprising the steps of:

mapping a first portion of code word bits only to lower byte data word bits;

mapping a second portion of code word bits directly to lower byte data word bits and directly to upper byte data word bits; and mapping a third portion of code word bits only to upper byte data word bits.

14. The process of claim 13, wherein the first portion of code word bits includes code word bits zero through four.

15. The process of claim 13, wherein the second portion of the code word bits includes code word bits five through eleven.

16. The process of claim 13, wherein the third portion of code word bits includes code word bits twelve through sixteen.

17. The process of claim 13, wherein each step of mapping includes mapping according to logic equations.

18. A program storage device readable by a machine for decoding a code word, tangibly embodying a program of instructions executable by the machine to perform method steps for mapping portions of code word bits, said method steps comprising:

mapping a first portion of code word bits only to lower byte data word bits;

mapping a second portion of code word bits directly to lower byte data word bits and directly to upper byte data word bits; and mapping a third portion of code word bits only to upper byte data word bits.

19. An apparatus for decoding a code word into a data word comprising:

means for mapping a first portion of code word bits only to lower byte data word bits;

means for mapping a second portion of code word bits directly to lower byte data word bits and directly to upper byte data word bits; and means for mapping a third portion of code word bits only to upper byte data word bits.

* * * * *